(12) United States Patent
Kouznetsov

(10) Patent No.: US 6,296,742 B1
(45) Date of Patent: *Oct. 2, 2001

(54) METHOD AND APPARATUS FOR MAGNETICALLY ENHANCED SPUTTERING

(75) Inventor: Vladimir Kouznetsov, Grodinge (SE)

(73) Assignee: Chemfilt R & D Aktiebolag, Norsborg (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/393,294

(22) Filed: Sep. 10, 1999

Related U.S. Application Data

(63) Continuation of application No. PCT/SE98/00442, filed on Mar. 11, 1998.

(30) Foreign Application Priority Data

Mar. 11, 1997 (WO) .................................. PCT/SE97/00411
Dec. 9, 1997 (SE) .................................................... 9704607

(51) Int. Cl.[7] .................................................. C23C 14/34
(52) U.S. Cl. .............................. 204/192.12; 204/298.08; 204/298.19; 204/298.07
(58) Field of Search ........................ 204/192.12, 298.08, 204/298.19, 298.07

(56) References Cited

U.S. PATENT DOCUMENTS

| | | | |
|---|---|---|---|
| 4,049,533 | * 9/1977 | Golyanov et al. | 204/298.26 |
| 4,167,370 | * 9/1979 | Graneau et al. | 417/48 |
| 4,692,230 | 9/1987 | Nihei et al. | 204/192.11 |
| 5,015,493 | * 5/1991 | Gruen | 427/571 |
| 5,224,015 | 6/1993 | Balland | 361/256 |
| 5,286,360 | 2/1994 | Szcyrbowski et al. | 204/298.08 |
| 5,300,205 | 4/1994 | Fritsche | 204/192.12 |
| 5,492,606 | * 2/1996 | Stauder et al. | 204/192.12 |
| 5,718,813 | * 2/1998 | Drummond et al. | 204/192.12 |
| 5,993,613 | * 11/1999 | Manley | 204/192.12 |

* cited by examiner

Primary Examiner—Rodney G. McDonald
(74) Attorney, Agent, or Firm—Nixon & Vanderhye PC

(57) ABSTRACT

In magnetically enhanced sputtering, pulses are applied having a very high instantaneous power, of the order of at least 0.1 kW–1 MW. In such sputtering regions exist in which electrons are trapped by the magnetic field generated by magnets cooperating with the electric field between the anode (part of the wall enclosing the chamber in which sputtering is performed) and the cathode (which at the same time is the target, from which material is to be sputtered). An ionization of the gas in the chamber will then for lower applied power occur preferably in those regions causing a non-uniform erosion of the target. For very high power in the pulses or power density in the pulses the gas in these regions, and in regions adjacent thereto, will enter another state of complete ionization, which considered in energy terms is located above the unwanted state of an electric arc which is formed for a lower supplied power. The region in which this another state exists will be more homogeneous and have a wider extension than the ionized regions produced for a lower supplied power. This results in a more uniform erosion of the target and a more uniform coating of the substrate. The high power pulses can also be used in sputtering ion pumps, allowing them to start pumping from moderately low pressures, e.g. in the range of $10^{-1}$–$10^{-2}$ torr.

20 Claims, 5 Drawing Sheets

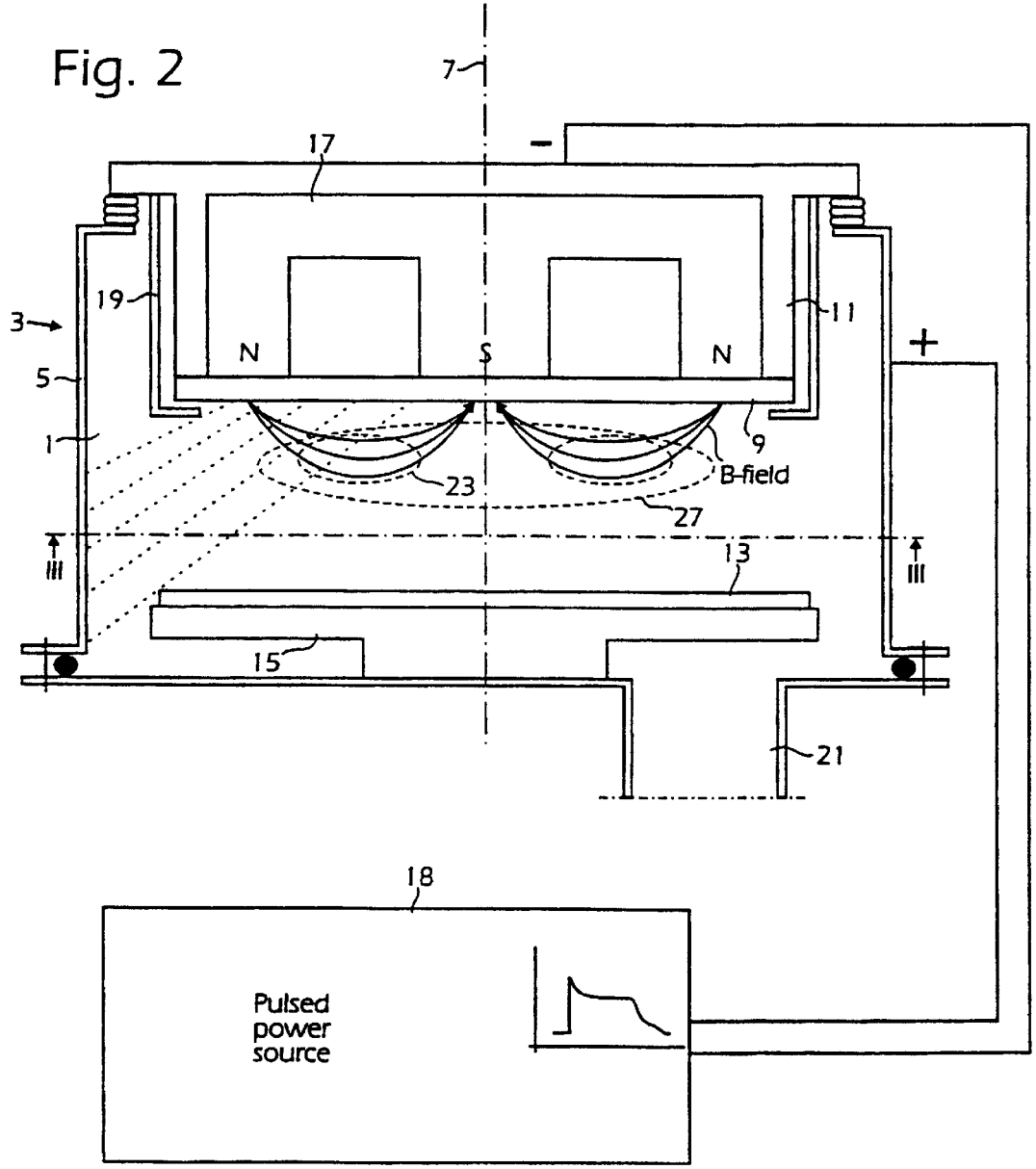

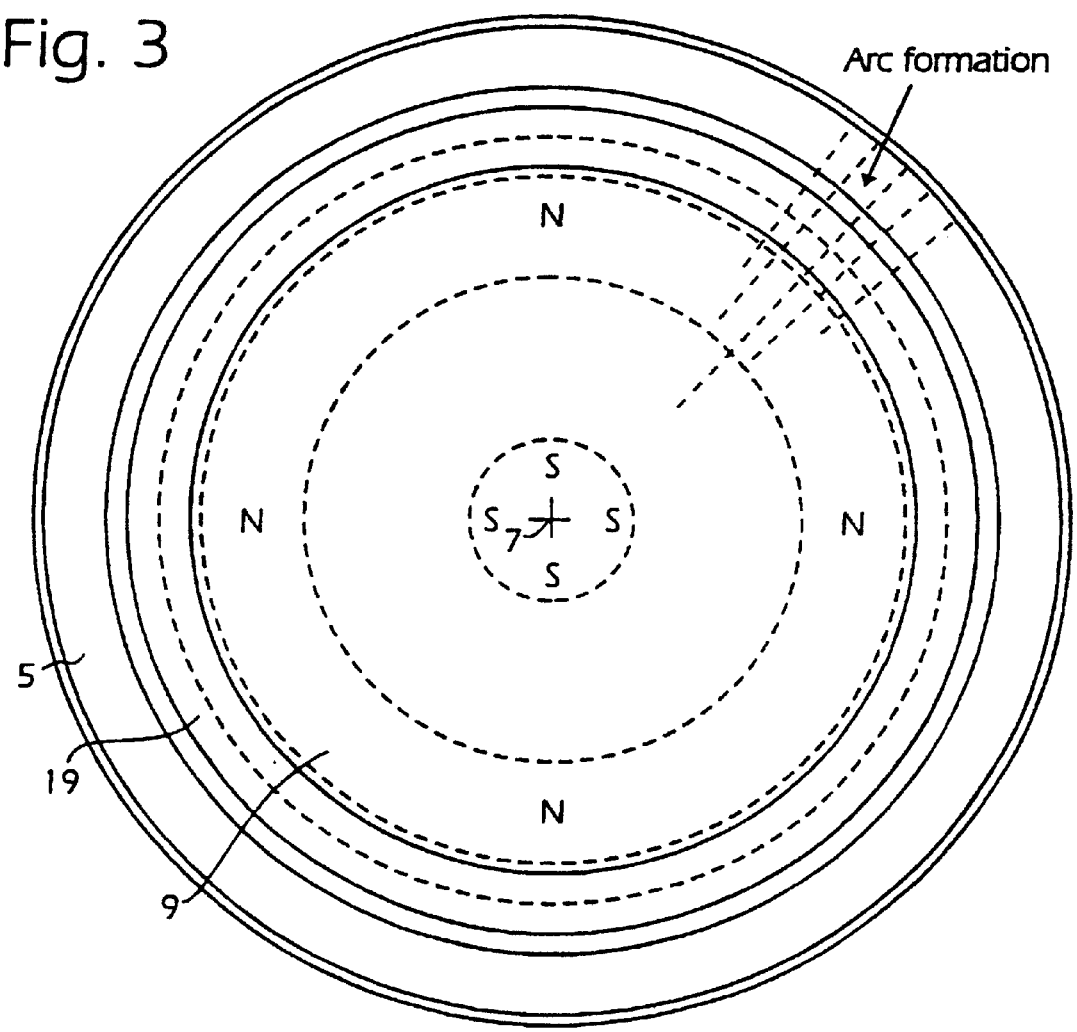

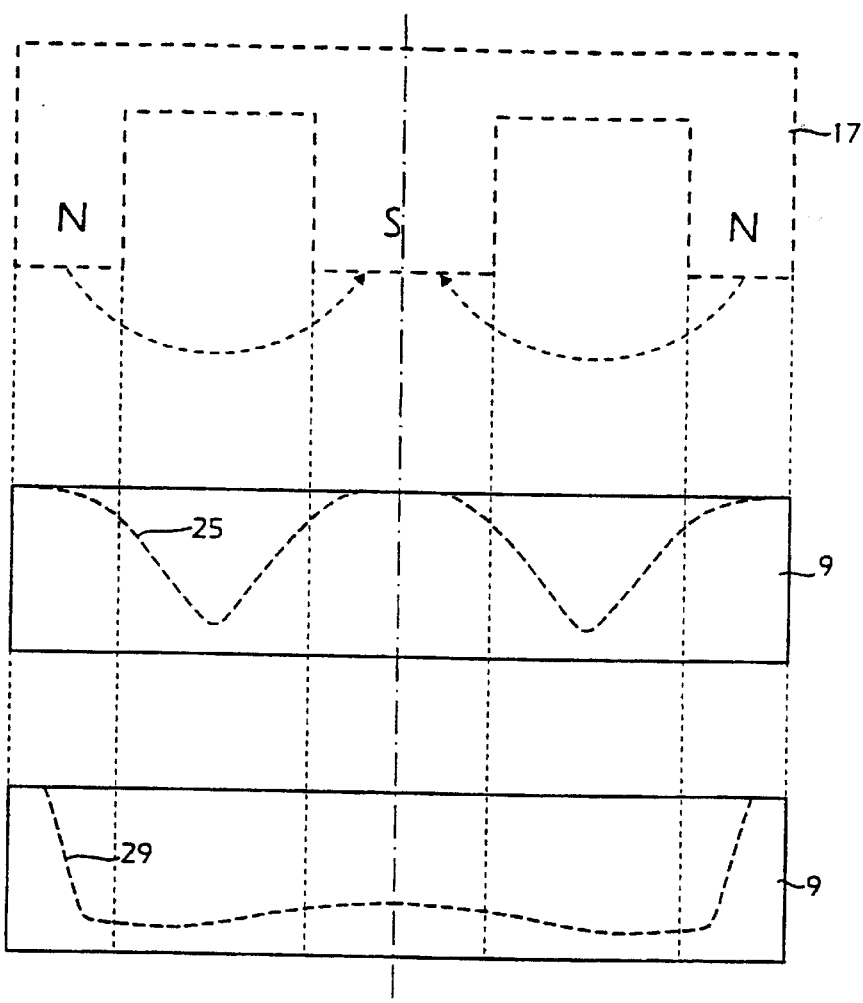
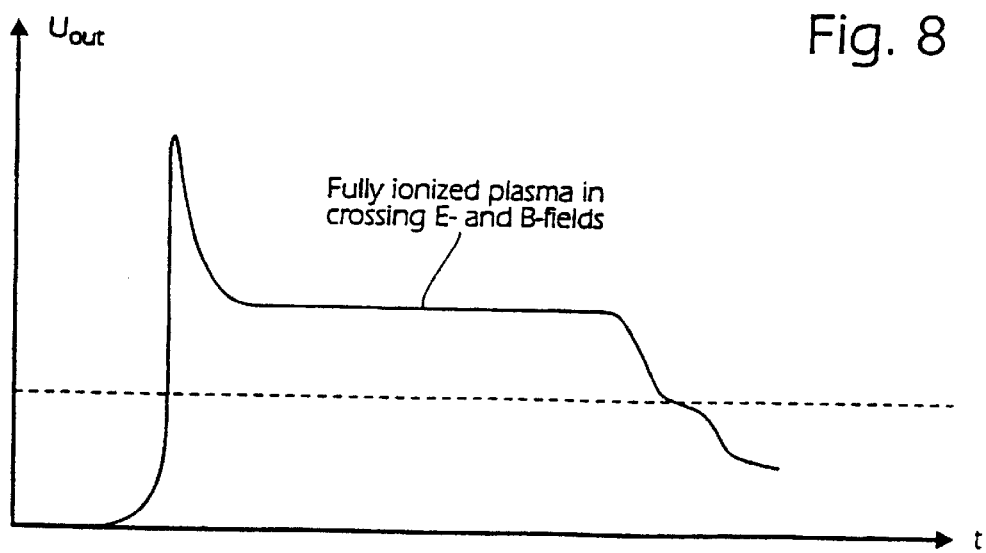

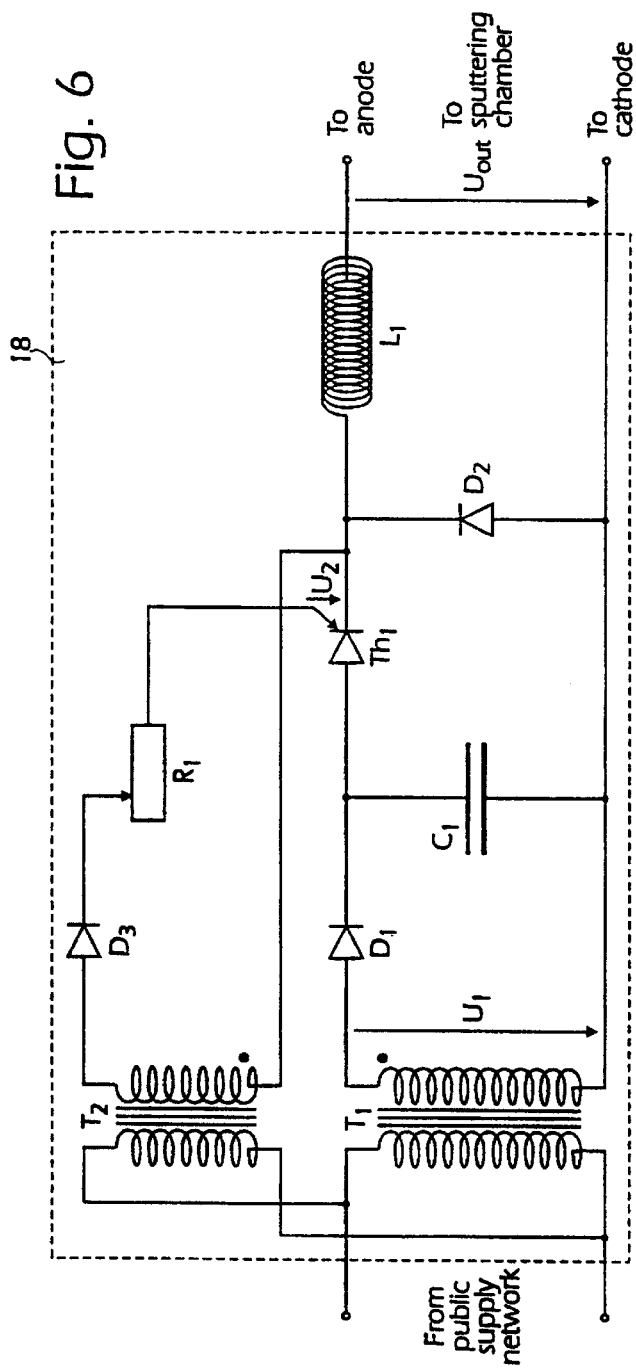

METHOD AND APPARATUS FOR MAGNETICALLY ENHANCED SPUTTERING

CROSS REFERENCE TO RELATED APPLICATION

This application is a continuation application under Section 35 USC §111 (a) of PCT/SE98/00442 filed Mar. 11, 1998.

The present intention relates to a method and apparatus for magnetically enhanced sputtering and also to a pulse generator to be used in the method and apparatus.

BACKGROUND AND STATE OF THE ART

In the sputtering coating process a kind of vapour is created, the atoms or molecules of which hit a substrate to be coated. The vapour is created by bombarding a target with ions derived from a gas, called the sputtering gas, which e.g can be an inert gas such as argon. The ions are created by maidg art electric discharge, thereby producing electrons which ionize the gas. In magnetically enhanced or magnetron sputtering a magnetic field is created in such a way as to trap and concentrate the electrons produced in the electric discharge to form an electron cloud. This electron cloud, which for a suitable design of the magnetic field will be located at the surface of the target and have a high density of electrons, will then cause ionisation of the sputtering gas in the region close to the target surface. The target has a lower electric potential than the region in which the electron cloud is formed and will then attract positive ions to move with a high velocity towards the target. The impact of these ions at the target dislodges atoms from the target material. The dislodged atoms will then move into the region outside the target surface and into all of the space where the discharge is made and the target is located. The atoms will fully be deposited on the ws of said space and thus also on the surface of the substrate.

Due to the relatively high ionisation efficiency of this process using magnetic confinement compared to other sputtering methods, relatively low power levels may be used, whereas at the same time high sputtering rates are achieved. Because electron losses perpendicular to the magnetic field intensity lines are restricted by the suitably designed geometry of the magnetic field, bombardment of the substrate is minimised and the heating of the substrate, in particular of the growing film on the substrate, is significantly smaller than in other sputtering methods. Electron losses in the directions of the magnetic field intensity lines are determined by the combined geometry of the magnetic and electrostatic fields, which can be designed to form a so called mirror confinement of the electrons.

However, magnetron sputtering have some drawbacks compared to other sputtering methods. One of the most important drawbacks is the low utilization of the target and the accompanying effect of obtaining deposited layers having a non-form thickness. This is caused by the localized ionization of the sputtering gas resulting essentially from the low electron temperature. Because of the low temperature and the confinement effects resulting from the geometry of the magnetic and electric fields, electrons which cause the ionization are concentrated in narrow regions above or at some small distance from the surface of the target. These narrow regions are also located between the poles of the magnets used for setting up the magnetic field. In these narrow, localized regions most of the ionization of the sputtering gas occurs. After the ionization the ions move and are accelerated towards the surface of the target, in paths substantially perpendicular to that surface. The location of the ionization regions will thus be mapped on the target surface resulting in a non-uniform erosion or wear of the target which in turn causes that only a restricted portion of the target can be used until it has been eroded through. The amount of ionized gas can be increased by increasing the voltage applied but then the probability of arc formation could be very high.

Magnetically enhanced sputtering is widely used in science and technology such as for coating object with various materials. The most important areas, in which magnetically enhanced sputtering is used, generally comprise magnetron sputtering devices intended for coating of work pieces. Also, in sputtering ion pumps for creating very low pressures a magnetically enhanced sputtering process is used in which the coating of some object is not the primary object, but in the process when fresh sputtered atoms are deposited on wall surfaces of a chamber they will adsorb molecules or atoms of the ionizing gas, lowering the pressure thereof.

Coating by means of sputtering and in particular magnetron sputtering is used within a multitude of technical fields. It can be used to produce anti-corrosion coatings, wear resistive coatings, thermo-resistive coatings, decorative coatings, optical coatings, transparent electroconductive coatings for displays, coatings of polymers with metallic fmims, ferromagnetic coatings for magnetic Memories, superconducting coatings for memory cells, ultrafine cogs for photo and X-ray patterns, hard coatings (carbides, nitrides), resistive coatings, metallisation in electronics and microelectronics, metallisation of RF, HF and UH equipment, etc. Advantageous characteristics of coatings produced by magnetron spring comprise for example a high adhesion to the substrate and a low porosity. Furthermore, magnetically enhanced sputtering will cause only small radiation damages to the substrate to be coated. Owing to the fact that a low temperature of substrate can be maintained during the coating process, also delicate materials can be coated. Magnetically enhanced sputtering allows a high sputtering rate and is also suited for reactive sputtering, in which atoms sputtered from the target combine with atoms in the gas to produce a coating consisting of molecules formed by the combined atoms. Furthermore, it allows sputtering of superconductive materials, sputtering of ferromagnetic materials, sputtering of composite materials and sputtering of materials having high melting temperanes.

Magnetron sputtering is in many respects advantageous compared to other similar coating methods such as electron-beam evaporation and RF-sputtering.

Furthermore, sputtering ion pumps are today used in a lot of different branches of science and technology where a high vacuum is required and used. In science, e.g. in atom physics, nuclear physics such as in particle accelerators, solid state physics, plasma physics for research in thermo-nuclear fusion, and in different investigations in electronics and microelectronics and in developing processes of deposition of layers for optical devices, for instruments, etc. In technology sputtering ion pumps are used in the processing for manufacturing electronic and amicroelectronic circuits, in industrial particle accelerators producing coatings for optical devices such as lenses and panes, in producing cutting and abrasive tools and in many other fields.

However, conventional sputtering ion pumps as well as other sputtering devices used today have some drawbacks. The most important drawback is the limited discharge power resulting from the fact that a degassing of electrodes can occur owing the heating thereof during the discharge used in the sputtering process. If the discharge power used in the conventional sputtering process is too high, the electrodes will be heated so much, that the rate of degassing of the electrodes exceeds the gas adsorption intensity of the electrodes. This phenomenon is most critical in the pressure range of $10^{-2}$–$10^{-5}$ torr. When starring the operation of a conventional sputtering ion pump in the pressure range of $10^{-2}$–$10^{-3}$ torr, the pump operation is thus characterized by a low voltage between electrodes of about –200 V and a high discharge current. Because of the low voltage the efficiency of sputtering for adsorbing atoms/molecules, also called getter sputtering, is very low and accordingly the pumping speed is also very low. If the discharge current is increased, the temperature of the electrodes will also be increased and consequently also the rate of degassing the electrodes. Also, in the somewhat lower pressure range of $10^{-3}$–$10^{-5}$ torr the discharge current is still too high and it is necessary to arrange a limitation of the discharge power.

As has already been observed, the conventional methods of magnetically enhanced sputtering such as magnetron sputtering and sputtering ion pumps have a number of draw-backs.

Methods have also been proposed in which the power to the sputtering process is provided in discrete or individual pulses. Thus, in U.S. Pat. No. 5,015,493 a process and apparatus are disclosed for coating conductive work pieces, using a pulsed glow discharge. Sputtering and ion plating methods are described. The region of abnormal glow discharge is used in the coating process, which can be magnetically enhanced.

SUMMARY

It is an object of the invention to provide a magnetically enhanced sputtering method and a magnetically enhanced sputtering device in which a high rate of utilization of target material can be obtained.

It is another object of the invention to provide a magnetically enhanced sputtering method and a magnetically enhanced sputtering device in which a high uniformity of deposited layers is obtained.

It is another object of the invention to provide a magnetically enhanced sputtering method and a magnetically enhanced sputtering device to be used in sputtering ion pumps allowing the pumps to start operating from an initial pressure of $10^{-1}$–$10^{-3}$ torr or even higher.

It is another object of the invention to provide a magnetically enhanced sputtering method and a magnetically enhanced sputtering device to be used in sputtering ion pumps allowing that the problems associated with overheating magnetron/Penning cell electrodes in such pumps are overcome.

It is another object of the invention to provide a pulse generator allowing the generation of pulses having a very high power suited for use in magnetically enhanced sputtering.

In a magnetically enhanced sputtering method and a corresponding magnetically enhanced is sputtering device a pulse generator is arranged producing very powerful discrete pulses, the pulses thus being delivered to the electrodes of a magnetron sputtering unit primarily intended for producing coatings or to the electrodes of a sputtering ion pump intended for producing very low pressures, in both cases however sputtered layers being produced. The power of each pulse can be in the range of 0.1 kW to 1 MW, preferably within the range 10 kW–1 MW for typical areas of the targets conventionally used in sputtering devices The pulses can have a duration in the range of less than a hundred microseconds up to hundreds of microseconds and the intervals between pulses can range from milliseconds up to seconds.

Thus a magnetic field is arranged at the surface of a target, the magnetic field having the conventional structure such as a magnetron configuration. The target is a usually stationary object, from which material is to be sputtered in order to be deposited. A gas which is chosen so that it can be ionized is supplied to the chamber containing the target, A negative voltage is applied between an anode and a cathode in the chamber, the cathode being the target and the anode e.g. parts of the walls of the chamber. An electric discharge then occurs between the anode and cathode, producing electrons trapped in the magnetic field by cooperation of the electric field produced by the applied voltage.

The negative voltage is applied in pulses having such a peak voltage and being provided in such a way, i.e. that so much power is developed in each pulse, that in the application of such a pulse, for a very short time during the start of the pulse, the state of the gas located at the region in which the electrons are trapped by the magnetic field will very rapidly reach a fully ionized state creating a substantially homogeneous plasma in a wider region extending at a large portion of the surface of the target and being located where crossing magnetic and electric fields exist. In the very rapid transition to the fully ionized state, the gas located in said region first adapts the state of a glow discharge, then continues to the state of an arc discharge in order to finally adopt a fully ionized state. In that way the rate of ionizing the sputtering gas is strongly increased compared to conventional methods. This to effect is thus primarily achieved by strongly increasing the instantaneous power of the discharge, which then must be pulsed, since otherwise the target and the components of the sputtering chamber would be heated too much. Thus an extremely high absolute level of pulsed electric power or equivalently an extremely high level of the power density in the electric pulses generated is provided to the sputtering device. This is accomplished using is electric pulses directed to the cathode, which have an extremely high power density as referred to the area of the cathode.

In the discharge very high currents and high current densities occur. However, if the current used is lower than a threshold value called the burn-out current, the discharge will always be an arc discharge, even if there are no oxide layers at the surface of the target.

It has been found that conventional magnetron sputtering devices can operate at such a high power level in the pulses without causing any significant formation of arc discharges, both in non-reactive and reactive sputtering. This high power level permits the production of a fully ionized plasma in the vicinity of the cathode, for a sufficiently high current density and a sufficiently high applied voltage. This discharge state is then far away from the glow discharge region used for conventional sputtering and can be called a state of pulsed powerful discharges in crossed/crossing electric and magnetic fields, an E x B-discharge.

The discharge pulses can be delivered from a charged capacitor through an inductor connected in series with the electrodes of the sputtering device, the pulses then having a shape comprising a very steep rising edge up to a peak voltage, this voltage then decreasing basically like an exponentially decreasing function. This is different from the method according to the cited U.S. patent in which square pulses are used. However, the load consisting of the gas between the electrodes in the sputtering device will at each instant determine the exact pulse shape, for instance maintaining a rather high, substantially constant voltage when the gas is in the highly ionized state of crossing electric and magnetic fields, as long as the input voltage is sufficient to sustain this state. Such pulses can easily be generated by an electric circuit having few components, using in addition to the capacitor and the inductor conventional solid state switches such as thyristors and rectifier diodes. The electric circuit can be adapted to generate pulses of a power up to e.g. 10 MW and the peak voltage of the generated pulses can range from zero up to tens of kilovolts. The peak voltage determines the power of the pulses and thus the power density generated in the sputtering device and the current passing between the electrodes and thus the current den.

Thus, the pulse generator generally comprises a discharge capacitor which is connected to be charged from a power supply. The capacitor is arranged to be discharged over the electrodes of the sputtering device through an inductor, the inductance of which is selected to limit the peak current of the discharge in order to obtain the desired plasma state of the sputtering gas. The capacitor can be charged through a diode from the secondary side of a first transformer. A switch element such as a semiconductor switch can be connected in a line extending from the capacitor to the electrodes for switching to the discharge state. The switch is then advantageously controlled to adopt a conducting state by an alternating is voltage having a substantially 180° offset in relation to an alternating current obtained from a power supply, also supplying power to the first transformer. This alternating voltage can then be obtained from the secondary side of a second transformer connected on its primary side to the same mains supply as the first transformer.

As already stated, the complete ionization of the gas in the vicinity of the target during the powerfull pulses allows that a high voltage is applied over the gap between the anode and the cathode target still maintaining the sputtering process without any formation of an electric arc. This can be achieved even in the pressure range of $10^{-1}$–$10^{-3}$ torr. The upper pressure limit is defined by the requirement of having electrons moving correctly in the intended way in the magnetic field. The voltage during the state of the completely ionized plasma can be hundreds of volts up to several kilovolts, in particular up to 4–5 kV. This phenomenon allows starting a sputtering ion pump for initial pressures of $10^{-1}$–$10^{-2}$ torr.

The complete ionization in an extended region results in a substantially uniform bombardment of the surface of the target, which gives a high rate of target utilization. For example, an aluminum disk having a thickness of 6 mm used as a target for sputtering according the method described above has a rate of utilization of 70%. The homogeneous ion flow will also result in a high uniformity of the layers deposited on e.g. a substrate.

A pulse generator suited for delivering the powerful pulses as described above can generally include some energy accumulator also based on for instance inductance or inertia/fly-wheel methods. However, the preferred design is a pulse generator based on charging/discharging a capacitor.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

FIG. 2 is a schematic cross-sectional view of a device for magnetic enhanced sputtering, FIG. 3 is a cross-sectional view of the device of FIG. 2 as seen in a direction perpendicular to that of FIG. 2 and taken along the line III—III, FIG. 4 is a schematic view of the magnetic part of the sputtering device of FIG. 2, FIG. 5a is a cross-sectional view illustrated the wear or erosion of a target in conventional magnetically enhanced sputtering, FIG. 5b is a cross-sectional view illustrating the wear or erosion of a target obtained when using high-power pulsed, magnetically enhanced sputtering as suggested herein, FIG. 6 is an electric circuit diagram illustrating a pulse generator unit for supplying high power pulses, FIGS. 7a and 7b are graphs showing two voltages as a function of time in the electric circuit of FIG. 6, and FIG. 8 is a plot illustrating the output voltage of the electric circuit according to FIG. 6 as a function of time.

DETAILED DESCRIPTION

Figure 1:
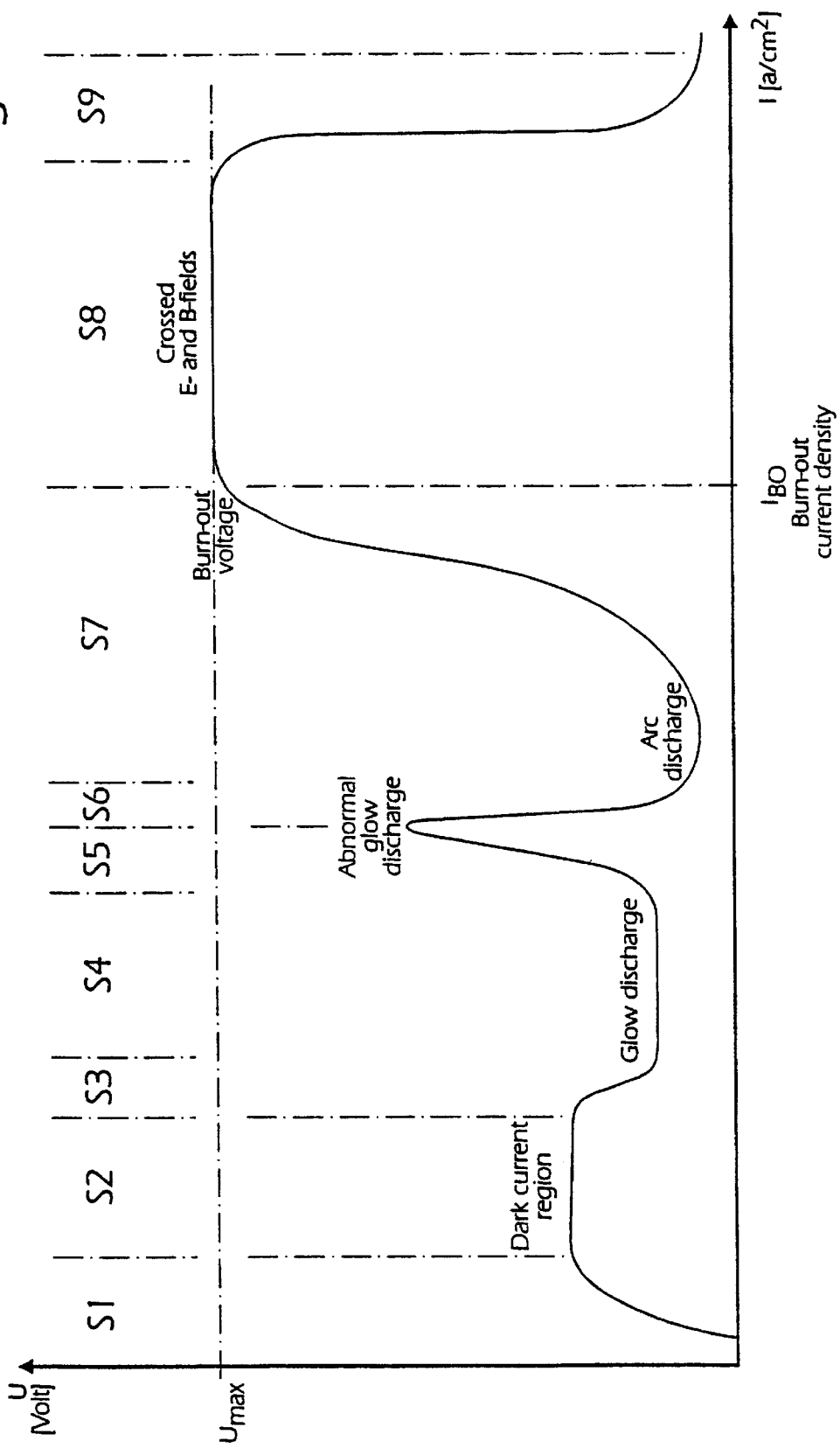
FIG. 1 is a diagram showing the voltage as a function of current density when an electric current is allowed to pass to through a region containing a gas and is gradually increased by applying suitable voltages.

In the diagram of FIG. 1 the voltage as a function of the current density is shown for an electric discharge between an anode and a cathode in a gas of an atmospheric or lower pressure. Thus when raising the voltage over a gas which for example is enclosed in a chamber and simultaneously the current density, there will first be some very small current ("dark current") flowing through the gas, see regions S1 and S2, up to some break-down voltage, see region S3, when the voltage drops and a glow discharge is obtained, see region S4. The gas is then partially ionized, issues visible light and there is a considerable amount of heat developed in the gas. The voltage will then be approximately constant for increasing current in region S4 up to the range of abnormal glow discharge in which the voltage increases rather steeply up to a rather high voltage, see region S5. Another break-down will occur thereafter, see region S6, in which the voltage drops to a very low value of at most a few tens of volts, this range being the arc discharge region S7 used for welding metals. Then very much heat is developed in the heated gas, which will be only partly ionized. Also the ions thereof will be transported very rapidly to the localized places on the surfaces, between which the voltage is applied, heating these places intensely, especially on the cathode, from which material will be rapidly transported away to make the cathode erode quickly and obtaining localized non-uniform coatings. This state will ordinarily exist up to very high current intense.

It appears, however, that for the state existing in the active portion of the gas used for magnetically enhanced sputtering, this active portion then being subjected to or located in a is region in which there are crossing electric and magnetic fields, when increasing the current intensity from the first portion of the arc discharge range S7, the voltage will suddenly increase considerably in said region, typically to a voltage of some hundreds of volts, see region S8. Then a completely ionized plasma will be formed in the region, this plasma being homogeneous and exhibiting some other transport properties than the plasma in the ordinary arc discharge region 57. This plasma is only obtained in region or regions where there are crossing electric and magnetic fields, and even for the moderate magnetic field strengths used in commercial magnetron sputtering devices. The voltage applied over the gas must be larger than a threshold voltage called the burn-out voltage $U_{max}$ to achieve and maintain this completely ionized state for crossing electric and magnetic fields. If the current intensity will be increased even more, the gas will leave the plasma state of region S8 and enter the region S9, in which an arc discharge is again obtained. Gas in the region S8 is used in the method and device to be described hereinafter. In order to obtain a gas in. that region obviously the current intensity must be kept within certain limits.

In FIG. 2 a basically conventional magnetron sputtering device is schematically shown in a cross-sectional view taken in a plane rough an axis of the device, the device being also shown in the cross-sectional view of FIG. 3 taken in a plane III—III perpendicular to the axis. A sputtering chamber 1 is formed in the interior of a housing 3 having walls 5 made of e.g. stainless steel plate, the walls of the housing thus being electrically conducting, and the housing having the shape of circular cylinder. The chamber 1 and the housing 3 have thus a common symmetry axis 7 forming the axis of the device and most of the components in the chamber are also arranged symmetrically in relation to this axis. In panel to the flat end walls of the cylinder is the target 9 located, carried by a support 11 made of some electrically conducting material. The target 9 is a circular plate made of the material, which is to be applied to some object, and the support 11 has an annular, flat circular surface, to which the target is attached. The target 9 is located more adjacent to one of the flat end walls of the cylindric housing 3 and at the opposite end wall is the substrate 13, which is to be coated, located. The substrate 13 can e.g. be plate-shaped and is attached to some electrically isolating support 15 at that end wall.

At the rear side of the target 9, at that source which is not direct towards the center of the chamber 1, a magnet or magnets 17 are mounted so that the north pole or poles are arranged at the periphery of the target and the south pole or poles at the center of the support 11 and the target 9. The magnetic field lines of the magnets 17 thus pass from the periphery of the support 11 to the center thereof. The magnetic field is most intense at the poles of the magnets 17. At the region between the periphery and the center of the target 9 there is thus a smaller intensity of the magnetic field. The electric system of the sputtering device comprises electrodes between which a voltage from a power supply 18 is applied for is ionizing the gas in the chamber. One electrode, the anode, is formed by the electrically conducting walls 5 of the housing 3, which e.g. can be grounded. The other electrode, the cathode, is formed by the target 9, which is thus negatively biased in relation to the anode. The substrate 13 can have some neutral electric potential. The support 11 has its sides protected by shields 19. A gas inlet for a suitable gas to be ionized such as argon is indicated at 21.

When increasing the voltage from zero and on between the anode 5 and the cathode 9, there will for some applied voltage appear an electric glow discharge. The gas in the region between the anode and cathode will be partly ionized by electrons. The electrons will be somewhat tapped or confined by the magnetic field primarily moving in the areas of low magnetic field intensity, i.e. in regions 23 located at the target surface, between the periphery and the center of the target. In these regions the gas will then be more ionized, so that there is a larger concentration of ions in these regions. The positively charged ions hit the surface of the target 9 owing to the sign of the voltage applied, "kicking" atoms of the target material into the space outside the target surface, these atoms forming a kind of "vapour" in the chamber. The atoms in this vapour can then be directly deposited on the walls of the chamber, i.e. also on the substrate to be coated, or first combine with atoms of the gas in the chamber to form molecules which are deposited on the walls of the chamber. This is the state of ordinary sputtering and reactive sputtering. Because of the localized high concentration of ions in the regions at 23, the ions wire primarily also hit the target surface at areas directly adjacent or below these regions having a high concentration of ions. Thus there will be more atoms kicked away in these areas of the target, resulting in an inhomogeneous wear of the target. This is illustrated by the cross-sectional view of the target in FIG. 5a, see the V-shaped areas 25 withing dashed lines indicating the areas of preferred wear. The location of the erosion of the target 9 in FIG. 5a is illustrated by dashed thin lines drawn from the magnet 17 schematically shown in FIG. 4.

The voltage between the anode 5 and the cathode 9 is increased even more so that the gas in the chamber enters the range of arc discharge, see FIG. 1. Then there will be a sudden voltage drop and a localized discharge is formed between some part of the periphery of the target 9 and the adjacent conducting wall 5 portion of the housing 3. In this discharge there will be strong flow of electrons and ions moving in a narrow column or sector between the target 9 and the adjacent wall portion. Owing to the magnetic field and the moving charger interacting with the field, forces are created on the charges moving in the narrow discharge sector so that it will begin to move and circulate along the periphery of the target 9. In this range mostly atoms will be directly transferred from the target 9 to the wall anode, which is most undesirable. When increasing the voltage and current still more, there will appear the state described above comprising a completely ionized plasma region 27, the region being stationary located above the surface of the target 9 and having a larger extension laterally, in the direction of the surface of the target 9 than the region 23 of high electron and ion density used in ordinary sputtering. This state is made possible by the arrangement of the electric and magnetic fields crossing each other in the magnetron configuration. Furthermore, in this state, owing to the considerable extension and the relative homogeneity and uniformity of the ionized plasma in the region 27, ions will hit the target surface more regularly and uniformly distributed over the surface. This will result in a more homogeneous wear of the target surface, as illustrated by the area delimited by the dashed line 29 in FIG. 5b.

The voltage will in this this transfer from and are discharge also increase suddenly to values of hundreds of volts, as stated above. Owing to the electrical current intensities which now are also very high, there will be a tremendous power developed in the ionized plasma, causing a very high rate of erosion of target material and also a very rapid increase of the temperature in the target. This state is therefore only maintained for a very short time, in the order of one hundred microseconds. The periods of this state having the very high power developed are repeated regularly so that the average power developed will not be too high, allowing the thermal energy eventually resulting from the electric power generated to be conducted away or dissipated by the normal cooling circuits arranged in commercially available sputtering apparatus, for instance arranged in the target support table and possibly in the chamber walls.

To the power supply 18 the connected electrodes 5, 9 of the device for magnetically enhanced sputtering as described above behaves like a generally resistive, variable load.

Discontinuous variations of the load during the start period of the applied pulses up to the stationary state of complete ionization in the crossing electric and magnetic field will appear, the load ranging from $10^5$ ohms down to 1 ohm. In order to have a mode of operation in magnetron sputtering allowing high current and high electrical efficiency it is necessary to have an output voltage of more than 350 V from the generator 18 and a resistance of the generator 18 much smaller than 1 ohm. Some general requirements on the generator 18 are as follows: Output voltage in the range of 0.35–5 kV, a power of each generated pulse comprised in the range of 10 kW–1 MW and an average power delivered comprised in the range of 0.5–5 kW.

In FIG. 6 a circuit diagram of a pulse generator 18 is shown, suited for delivering the high power pulses as described above. A first transformer $T_1$ has its primary winding connected to line mains and its secondary winding connected to a discharge capacitor $C_1$ through a diode $D_1$. One of the electrodes of the capacitor $C_1$ is directly connected to an electrode of the sputtering device, and the cathode, the other one of the electrodes of the capacitor, is connected to the other electrode, the anode, of the sputtering device through a thyristor $Th_1$ and an inductor $L_1$. The output side of the thyristor is connected to the line coupled to the cathode through a diode $D_2$. The thyristor $Th_1$, gets its gate control voltage from a control circuit comprising another transformer $T_2$. This transformer $T_2$ has its primary winding connected to the same mains supply as the first transformer and in the same way. One of the terminals of the second winding of the second transformer $T_2$ is directly connected to the output line of the thyristor $Th_1$, i.e. to a point downstream the thyristor. The other terminal of the secondary winding of the second transformer $T_2$ is connected to the gate of the thyristor $Th_1$ through a diode $D_3$ and a potentiometer $R_1$. The polarities of the connections of the secondary windings of the transformers $T_1$, $T_2$ are chosen so tat the discharge capacitor $C_1$ is charged during one half period of the mains supply and is discharged during the directly following half period.

The operation of the circuit shown in FIG. 6 will now be described with reference also to the diagrams of two voltages as a function time illustrated in FIGS. 7a and 7b. Tus the capacitor $C_1$ is charged, due to the diode $D_1$, during a first half-period or even first quarter of a period of the alterating voltage of the mains supply, up to the peak voltage or amplitude of the alternating voltage generated by the first transformer, as can be observed in the diagram of FIG. 7a. During the next half-period, the capacitor $C_1$ cannot be charged any more because of the diode $D_1$. Instead the voltage on the gate of the thyristor $Th_1$ will now start increasing to a positive value, see FIG. 7b, after having had only a small value during the first half-period, the voltage being referenced to the output line of the thyristor. For some voltage on its gate the thyristor will become conducting and then the capacitor $C_1$ is discharged through the inductor $L_1$ between the anode and the cathode of the sputtering chamber. The inductor $L_1$ then acts to primarily limit the peak current delivered when discharging the capacitor $C_1$. If there was no inductor connected in the discharge circuit, the current during the discharge would rise too high, e.g. to hundreds of kiloamperes, what would not work for a discharge of the kind considered here, i.e. for passing through the arc discharge state S7 into the state S8 and staying there, not entering the higher arc discharge S9. Typically, the capacitor $C_1$ can have a capacitance of about 10 $\mu$F or even 1 $\mu$F and the inductor $L_1$ an inductance of about 25 $\mu$H. Owing to the current limitation accomplished by connecting the inductor $L_1$ in the way described, the capacitor $C_1$ can be a standard component, e.g. designed for maximum voltages of about 6 kV. The thyristor $Th_1$ should be capable of switching e.g. 9 kA during the very short pulses generated. The inductor $L_1$ can be a coiled, rather short conductor holding 10–20 turns of copper wire of a diameter of about 5 mm, freely suspended in space and thus not requiring any electric isolation.

In the electric circuit shown in FIG. 6 the pulses will be generated at the frequency of the mains supply, i.e. typically with a frequency of 50 or 60 Hz. In the general case however, the timing can be changed, either by connecting the generator to a mains supply having a variable frequency or by using a more sophisticated control circuit for controlling the gate of the thyristor to permit a variation of time between the generated pulses. In that way the average discharged power will also be changed, maintaining the power of each generated pulse.

The output voltage delivered from the generator 18 is plotted as a function of time in the diagram of FIG. 8. When the voltage of the capacitor $C_1$ is fired through the inductor $L_1$ the output voltage will rise very fast. Typically during a time period of at most a few microseconds, e.g. 4 $\mu$s, to a peak value of a few kilovolts such as about 2 kV. Then the output voltage decreases to a level, which is determined by the voltage given by the above described state of a fully ionized plasma in crossing electric and magnetic fields. During the very short time from the beginning of the pulse up to reaching this level the gas in the sputtering chamber has thus run through the states S1–S7 described above comprising a glow discharge state in region S4 and an electric arc state in region S7. The output stays at the level corresponding to the state of a fully ionized plasma, i.e. in the region S8 of FIG. 1, until the output voltage of the capacitor $C_1$ has decreased to a level where it cannot sustain said plasma. The plasma state disappears and then the voltage decreases again to a lower level. The total length of the pulse can typically be in the range of about 50 microseconds to a few hundreds of microseconds.

A pulse generator constructed as described above and used for magnetically enhanced sputtering has a low output impedance and a high electrical efficiency. Furthermore it allows a very high power in each delivered pulse, such as at least up to 1 MW. The pulse generator can be connected to all kinds of devices using magnetically enhanced sputtering, such as to a magnetron sputtering unit and to a magnetically enhanced, sputtering ion pump unit. It can be used for powering devices having a wide range of operating pressures such as in the range of $10^{-1}$–$10^{-5}$ torr, in particular allowing the so of sputtering ion pumps at not too low pressures. In the case where it is connected to a magnetron sputtering unit it will allow a high rate of target utilisation and a high uniformity of deposited layers.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

What is claimed is:

1. A method of magnetically enhanced sputtering comprising:
   (a) providing a magnetic field in a magnetron configuration at the surface of a target, from which material is to be sputtered;
   (b) providing a sputtering gas to be ionized in a chamber containing the target; and
   (c) applying a negative voltage between an anode and a cathode in the chamber, the cathode producing electrons trapped in the magnetic field; and
       wherein (c) is practiced in a manner so that the negative voltage is applied in pulses having peak voltage and so that in the application of each said pulse, a rapid voltage increase is provided at the leading pulse edge in a manner so that during the rapid voltage increase at the leading pulse edge the gas located at and in the region in which the electrons are trapped by the magnetic field first adopts a glow discharge state, then continues to an arc discharge state, and thereafter to a fully ionized state creating a substantially homogeneous plasma having a high rate of ionizing the sputtering gas.

2. A method according to claim 1 wherein (c) is further practiced so that the pulses are provided in such a way that the transitions between the glow discharge, arc discharge, and fully ionized states all occur rapidly during substantially the leading edge of a pulse as pulse voltage is increasing.

3. A method according to claim 2 wherein (c) is further practiced so that the pulses are provided in such a way that the power developed in a pulse is in the range of 0.1 kW–1 MW.

4. A method according to claim 3 wherein (c) is further practiced so that the pulses are provided with a duration in the range of 50 µs–1 ms.

5. A method according to claim 4 wherein (c) is further practiced so that the pulses are provided with an interval between the pulses in the range of 10 ms–1000 s.

6. A method according to claim 5 wherein (c) is further practiced so that the pulses are generated to have a peak voltage between 0.5 kV and 5 kV.

7. A method according to claim 1 wherein (c) is practiced so that the pulses are provided with a duration in the range of about 50–200 µs.

8. A method according to claim 1 wherein (c) is further practiced so that the pulses are provided with an interval therebetween in the range of 10 ms–50 ms.

9. A method according to claim 1 wherein (c) is further practiced so that the pulses generated have a peak voltage between 0.5 kV and 5 kV.

10. A method according to claim 1 wherein (c) is further practiced so that the pulses are provided in such a way that the power developed in a pulse is in the range of 0.1 kW–1 MW.

11. Apparatus for magnetically enhanced sputtering, comprising:
    at least one magnet which provides a magnetic field in a magnetron configuration at the surface of a sputtering target, from which material is to be sputtered,
    a chamber containing the target, the chamber having an inlet for introduction into the chamber of a sputtering gas to be ionized,
    an anode and cathode in the chamber, the cathode including the target;
    a voltage source for applying a negative voltage between the anode and the cathode in the chamber in order to make a discharge between the anode and cathode, so that electrons are produced which are trapped in the magnetic field; and
    wherein said voltage source applies the negative voltage in a plurality of pulses each of the pulses having a peak voltage, in a manner so that in the application of one of said pulses a rapid voltage increase is provided at the leading pulse edge so that during said rapid voltage increase at the leading pulse edge the sputtering gas located at and in the region in which the electrons are trapped by the magnetic field first adopts a glow discharge state, then an arc discharge state, and thereafter a fully ionized state creating a substantially homogeneous plasma.

12. Apparatus according to claim 11 wherein said apparatus comprises a magnetron sputtering unit for coating objects.

13. Apparatus according to claim 11 said apparatus comprises a sputtering ion pump for creating a high vacuum.

14. Apparatus according to claim 13 wherein said ion pump starts pumping at a pressure in the range of $10^{-1}$–$10^{-2}$ torr.

15. A generator for delivering pulses to an apparatus for magnetically enhanced sputtering, comprising:
    electrodes connected to the generator, a voltage being applied over the electrodes to cause a discharge therebetween, said voltage being applied in the form of at least one pulse so that during a voltage level increase of said pulse a sputtering gas located at a region in which electrons are trapped by a magnetic field first adopts a glow discharge state, then an arc discharge state, and thereafter a fully ionized state; and
    a discharge capacitor charged from a power supply, the capacitor operatively connected to the electrodes to be discharged over the electrodes through an inductance or inductor limiting the peak current of the discharge.

16. A generator according to claim 15 wherein the power supply comprises a first transformer connected on its primary side to a main supply and connected on its secondary side to the discharge capacitor; and further comprising a diode being connected in one of the lines from the secondary side to the discharge capacitor.

17. A generator according to claim 16 further comprising a semiconductor switch connected in a line extending from the discharge capacitor to the electrodes.

18. A generator according to claim 17 wherein the switch is controlled to adopt a conducting stage by an alternating voltage having a substantially 180° offset in relation to an alternating current obtained from the power supply.

19. A generator according to claim 16 further comprising a second transformer connected on its primary side to the same main supply as the first transformer and connected to deliver on its secondary side a voltage being substantially 180° offset in relation to an alternating current obtained on secondary side of the first transformer, the offset voltage being connected to a control input of a semiconductor switch, the switch controlling the discharge of the discharge capacitor over the electrodes.

20. A generator according to claim 15 further comprising a semiconductor switch connected in a line extending from the discharge capacitor to the electrodes.

* * * * *